US006576962B2

United States Patent
Rockett

(10) Patent No.: US 6,576,962 B2
(45) Date of Patent: Jun. 10, 2003

(54) CMOS SRAM CELL WITH PRESCRIBED POWER-ON DATA STATE

(75) Inventor: Leonard R. Rockett, Washington, DC (US)

(73) Assignee: BAE Systems Information and Electronics Systems Integration, Inc., Rockville, MD (US)

( * ) Notice: Subject to any disclaimer, the term of this patent is extended or adjusted under 35 U.S.C. 154(b) by 0 days.

(21) Appl. No.: 09/911,871

(22) Filed: Jul. 25, 2001

(65) Prior Publication Data

US 2002/0020885 A1 Feb. 21, 2002

Related U.S. Application Data

(63) Continuation-in-part of application No. 09/598,681, filed on Jun. 21, 2000, now Pat. No. 6,429,492.
(60) Provisional application No. 60/220,700, filed on Jul. 25, 2000.

(51) Int. Cl.[7] .............................................. H01L 29/72
(52) U.S. Cl. ...................... 257/367; 257/369; 257/370; 257/373; 257/374
(58) Field of Search ................................ 257/367, 369, 257/370, 373

(56) References Cited

U.S. PATENT DOCUMENTS

| 4,024,418 A | | 5/1977 | Hankel |
| 4,805,148 A | | 2/1989 | Diehl-Nagle |
| 5,286,663 A | * | 2/1994 | Manning ..................... 257/369 |
| 5,296,723 A | | 3/1994 | Nobe et al. |
| 5,350,933 A | | 9/1994 | Yoshihara |
| 5,536,960 A | * | 7/1996 | Hayashi ....................... 257/369 |

* cited by examiner

Primary Examiner—Edward Wojciechowicz
(74) Attorney, Agent, or Firm—Wallace G. Walter

(57) ABSTRACT

A CMOS SRAM cell with prescribed power-on data state having first and second cross-coupled inverters each defined by serially connected complementary MOS transistors (T1/T2; T3/T4) serially connected between $V_{dd}$ and circuit ground to form a first inverter with a first data node (A) between the two transistors (T1/T2) of the first inverter, and, in a similar manner, to form a second inverter with a second data node (B) between the two transistors (T3/T4) of the second inverter. The gates of transistors of each inverter are connected together and cross-coupled to the data node of the other inverter. An access transistor (T5) is connected between a bit line (BL) and the first data node (A) and another access transistor (T6) is connected between a complementary bit line (BLC) and the second data node (B) to provide data access thereto. A diode (D) is connected in the gate circuit between the complementary P and N type MOS transistors of one of the two latches to change the gate charge time to assure that each latch will assume a predetermined state upon power-up. The diode (D) can be implemented in dual work function polysilicon topologies by selectively doping adjacent regions of the single gate level polysilicon with an appropriate polysilicon doping type and concentration for each transistor type to form a PN junction (16) in the polysilicon (18). A window or opening (20) is formed in the silicide strapping layer (18) to enable the PN junction (16) operation.

12 Claims, 2 Drawing Sheets

FIG. 1
PRIOR ART
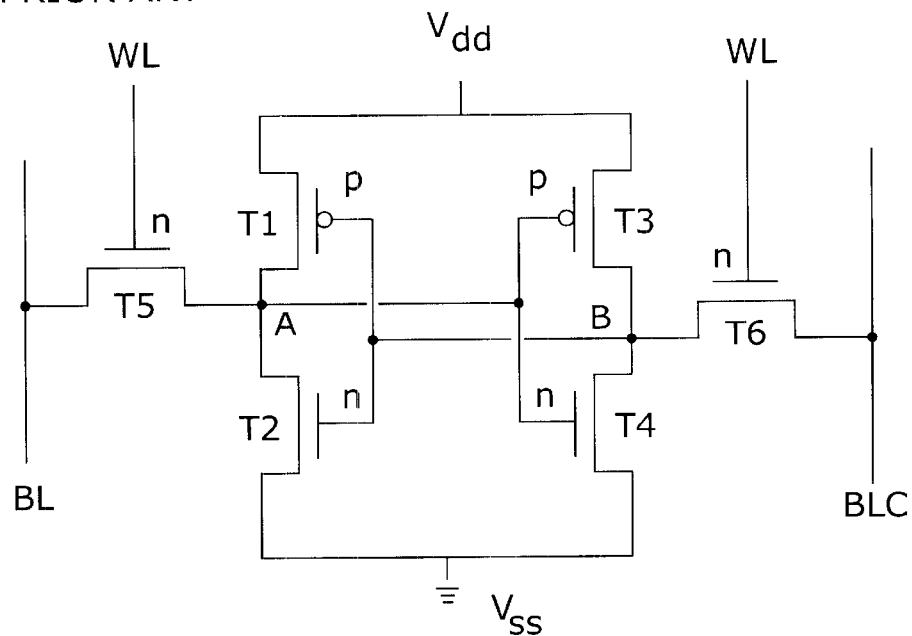
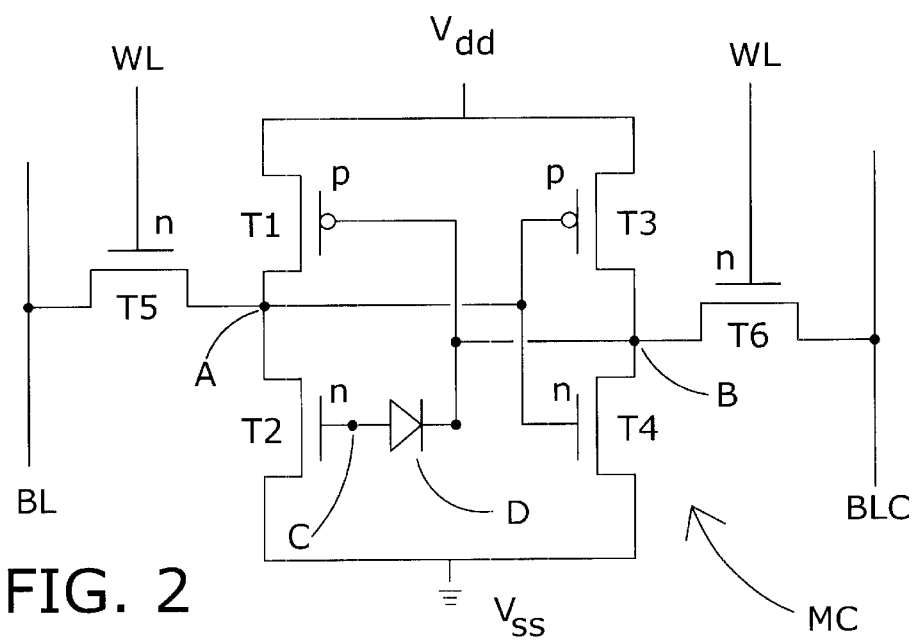
FIG. 2

CM OS SRAM CELL WITH PRESCRIBED POWER-ON DATA STATE

CROSS REFERENCE TO RELATED APPLICATIONS

This application claims the benefit of the filing date of co-pending U.S. Provisional Patent Application No. 60/220, 700, filed Jul. 25, 2000 by the applicant herein and is a continuation in part of U.S. patent application Ser. No. 09/598,681 filed by the applicant herein on Jun. 21, 2000, now U.S. Pat. No. 6,429,492.

BACKGROUND OF THE INVENTION

The present invention relates to a CMOS SRAM cell and, more particularly, to a CMOS SRAM cell with prescribed power-on data state, i.e., a cell that assumes a known data state when powered-on.

FIG. 1 illustrates a standard CMOS static RAM cell defined by six MOS transistors T1, T2, T3, T4, T5, and TG; of these transistors, transistors T1 and T2 are PMOS transistors while the remaining transistors are of the NMOS type. Transistors T1 and T3 are serially connected between $V_{dd}$ and ground to form a first inverter with a data node A between the two transistors, and, in a similar manner, transistors T2 and T4 are likewise connected between $V_{dd}$ and ground to form a second inverter with a data node B therebetween. The gates of transistors of each inverter are connected together and cross-coupled to the data node of the other inverter. The transistor T5 is connected between the bit line BL and the data node A to provide data access thereto, and the transistor T6 is connected between the complementary bit line BLC and the data node B to similarly provide data access. The gates of the data access transistors T5 and T6 are connected to respective word lines WL; ancillary circuitry including differential-input sense amplifiers are not shown in FIG. 1.

The cross-coupled inverters of the memory cell of FIG. 1 have two stable states functioning to store either a binary one or a binary zero. More specifically, the data access transistors T5 and T6 are gated into conduction by an appropriate voltage applied to the respective word lines WL while a binary high is impressed on data node A via the bit line BL and a binary low is impressed on the complementary bit line BLC. The transistor T4 conducts to pull the data node B toward ground (binary low) while the data node A goes high. The opposite data state can be achieved by reversing the signals applied to the bit lines BL and BLC.

The representative memory cell of FIG. 1 is substantially bi-directionally symmetrical, this is, currents, voltage levels, and time durations are generally the same for either stable state. However, small differences between cells, such as manufacturing variations, doping variations, and other imbalances are such that the data state (i.e., a binary one or a binary zero) of a particular cell, upon power-up, cannot be predicted. Thus, in the context of a multi-cell memory array, the memory state of the multitude of cells cannot be known at power-up.

Known approaches to designing SRAM cells to have a known power-on data state have generally involved either asymmetrically designing the latch transistors of the cell so as to skew the switching thresholds of the cross-coupled inverters within the latch or by adding extra resistive and/or capacitive loading to one of the latch nodes to create asymmetric gate charging. These approaches undesirably causes the cell size to grow significantly, which is contrary to the objective of increasing the functional density of advanced microelectronics.

SUMMARY OF THE INVENTION

In view of the above, it is an object of the present invention, among others, to provide a CMOS SRAM cell with prescribed power-on data state.

It is another object of the present invention to provide a CMOS SRAM cell with prescribed power-on data state utilizing a PN junction in the gate circuit of one of the latches that define the cell.

It is still another object of the present invention to provide a CMOS SRAM cell with prescribed power-on data state an embedded PN junction in the gate circuit of one of the latches that define the cell.

In view of these objects, and others, the present invention provides a CMOS SRAM cell with prescribed power-on data state having first and second cross-coupled inverters each defined by serially connected complementary MOS transistors serially connected to form a first inverter with a first data node between the two transistors of the first inverter and a second inverter with a second data node between the two transistors of the second inverter. The gates of transistors of each inverter are connected together and cross-coupled to the data node of the other inverter. An access transistor is connected between a bit line and the first data node and another access transistor is connected between a complementary bit line and the second data node to provide data access thereto. A diode is connected in the gate circuit between the complementary P and N type MOS transistors of one of the two latches to change the gate charge time to assure that each latch will assume a predetermined state upon power-up. The diode can be implemented in dual work function polysilicon topologies by selectively doping adjacent regions of the single gate-level polysilicon with an appropriate polysilicon doping type and concentration for each transistor type to form a PN junction in the polysilicon. A window or opening is formed in the silicide strapping layer to enable the PN junction operation.

The present invention advantageously provides a CMOS SRAM cell with prescribed power-on data state but utilizing a PN polysilicon junction layer without increasing feature size or cell size.

Other objects and further scope of applicability of the present invention will become apparent from the detailed description to follow, taken in conjunction with the accompanying drawings, in which like parts are designated by like reference characters.

BRIEF DESCRIPTION OF THE DRAWING

FIG. 1 is a schematic diagram of a known six transistor (6T) CMOS static RAM cell;

FIG. 2 is a schematic diagram of a six transistor CMOS static RAM cell in accordance with the present invention having a PN diode in the gate circuit of one the latches that define the cell;

DESCRIPTION OF THE PREFERRED EMBODIMENT

Figure 3:
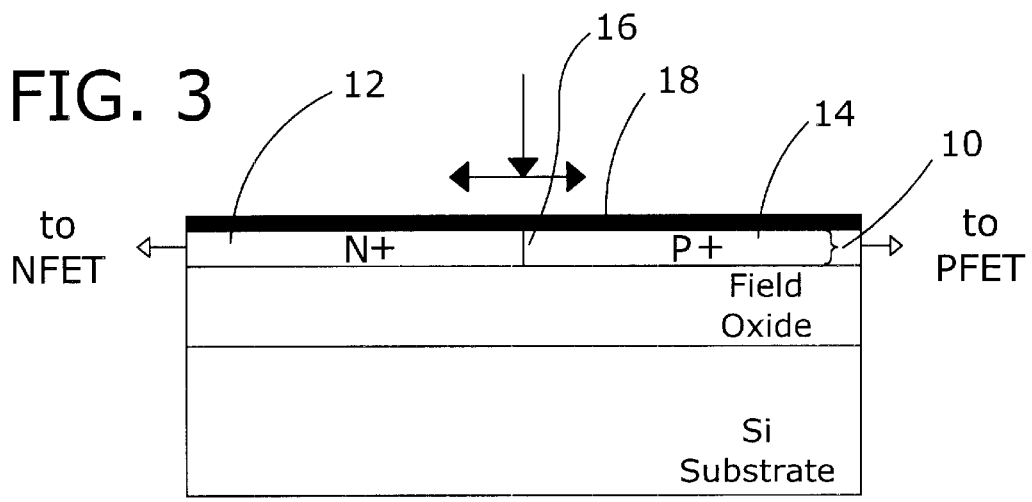
FIG. 3 illustrates, in cross-section, a dual work function polysilicon area of a CMOS static RAM cell of known topology.

A CMOS SRAM cell with a prescribed power-on data state in accordance with the present invention is shown in FIG. 2 and designated generally therein by the reference character MC. As shown, the memory cell MC is the same as that shown in the FIG. 1 but includes a polysilicon diode D in the gate circuit of one of the latch NFET's, i.e., transistor T3 in the case of the illustrated embodiment.

The polysilicon diode D restricts the charging current to the gate of the associated NFET so that, on power-up, the gate of the latch NFET that does not have the diode D at its gate charges more quickly. Consequently, the latch NFET without the diode turns ON quicker than the latch NFET with the diode D causing a known power-on data state to be assumed by the cell after power-up. The data node at the drain region of the latch NFET with the diode (i.e. node A in FIG. 2) will be at the high data state after power-up and the data node adjacent to the latch NFET without the diode (i.e., node B in FIG. 2) will be at the low data state after power-up.

Thus, in the context of FIG. 2, the power-up data state is node A high and node B low. The power-on charging asymmetry provided by the polysilicon diode D is generally large enough to override all mitigating effects such as inadvertent design or operational imbalances in the latch and varying rise times and noise associated with the power supply bus during power-up.

In accordance with the present invention, the diode D is introduced into the memory cell MC without the need for any additional component or and increase in the number of features that constitute the memory cell MC.

As is known in this technology, dual work function polysilicon gate electrodes are used in CMOS devices. More specifically, one single physical polysilicon level provides the gate electrode for both types of MOSFETS with an n-type polysilican used to form the gate electrode for the NFETs and a p-type polysilicon used to form the gate electrode for the PFETs. For single-layer dual work function polysilicon, regions of the gate level polysilicon are selectively doped to achieve the appropriate polysilicon doping type and concentration for each transistor type. Consequently, PN junctions are formed in the polysilicon at the boundaries of these doped regions.

For example and as shown in FIG. 3 and as explained in more detail below, dual work function polysilicon is achieved by selectively doping adjacent regions of the single gate-level polysilicon with an appropriate polysilicon doping type and concentration for each transistor type. Consequently, PN junctions are formed in the polysilicon at the boundaries of these two contiguous doping regions. Since the gate electrode must be highly conductive, a silicide layer straps the PN junctions, as illustrated in FIG. 3, to effectively shunt the polysilicon PN junctions and circumvent any impact these PN junction diodes would have had on the electrical response of the circuit. The I–V characteristic of the silicide strapped polysilicon PN junction is completely linear (i.e., a low resistive ohmic characteristic) with no rectification.

Figure 5:
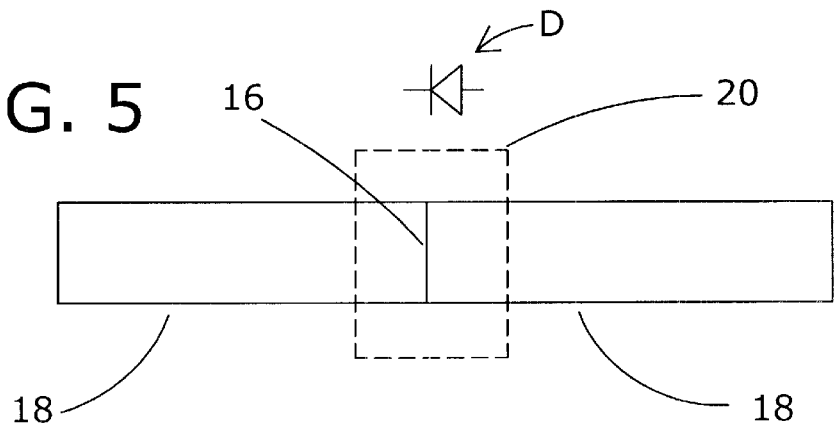
FIG. 5 is a partial top view of FIG. 4 showing a opened portion of the overlying conductive silicide layer to reveal a PN junction.

FIG. 3. illustrates, in cross-section, a portion of the gate level polysilicon doping pattern for the SRAM cell design; the various cell transistors are not shown in FIG. 3. The cell transistors have a standard, conventional structure and are made in a standard integrated circuit fashion. The dual work function polysilicon provides n-type polysilicon gate electrodes for the n-channel MOSFETs and p-type polysilicon gate electrodes for the p-channel MOSFETS. As shown in FIG. 3, a polysilicon layer 10 includes a N+ region 12 and a P+ region 14 defining a PN junction 16 therebetween. Polysilicon with one N+ and one P+ region, as shown in FIG. 5, is known as dual work function polysilicon. The N+ region 12 and P+ region 14 are formed as a result of ion implantation into the polysilicon layer 10 during formation of the N+ and P+ diffusions that form the source and drain regions of transistors in the silicon substrate. In general, the process includes depositing undoped polysilicon over a semiconductor substrate and patterning and etching the polysilicon over underlying features including, for example, transistor and/or other device regions, wiring regions, and thin and thick oxide regions. The patterning and etching of the polysilicon forms the polysilicon portion of devices, such as transistor gates, and polysilicon interconnects. After the polysilicon is patterned, N+ and P+ ion implantation steps are performed one at a time with an annealing step performed subsequent to the ion implantation step. Typically, these steps include forming oxide and photoresist masking layers followed by patterning and exposing masking regions to receive n-type or p-type doping, the dopant type dependent upon the step being performed. The n-type or p-type implant is generally made through the exposed regions in the masking layers.

After the polysilicon is patterned and doped as described above, a silicide layer 18, for example, a titanium silicide, is selectively formed on the polysilicon and other desired areas of the semiconductor. Silicide formation may be effected by forming oxide and photoresist masking layers to selectively expose and block portions of the polysilicon and other regions of the semiconductor. The photoresist may then be stripped, followed by depositing a layer of refractory metals commonly used in the formation of silicides, such as titanium. The titanium is then annealed to alloy the metal and the polysilicon to form a silicide layer onto selective portions of the polysilicon layer. Other refractory metal commonly used in the formation of silicides include tantalum, platinum, tungsten, and chrome.

The silicide layer increases the electrical conductivity of the underlying polysilicon and the source/drain regions, as is known in the art.

As a result of ion implantation, the polysilicon layer 10 has a N+ doping over N-MOSFET devices and, similarly, the polysilicon layer 10 has a P+doping over P-MOSFET devices. In the wiring region between N and P MOSFETS, the polysilicon layer 10 has a single boundary between adjoining regions that are exposed to one of N-type or the P-type doping. Therefore, conventionally, the PN junction 16 is formed between adjoining N-MOSFET and P-MOSFET devices.

In order to avoid rectification at the PN junction 16, the silicide layer 18 is conventionally formed over the polysilicon layer 10. Since the conductive silicide layer 18 is formed over the N+ region 12 and P+ region 14, current flows between each of the regions 12 and 14 of the polysilicon layer 10 and the conductive silicide 18 thus effectively short-circuiting or shunting the PN junction 16 and eliminating the effects of the PN junction 16 on current carried along the layer 18 and the underlying layer 10. Thus, in conventional processing, the PN junction 16 of FIG. 3 is functionally negated by the conductive silicide layer 18 formed over the dual work function polysilicon layer 10.

Figure 4:
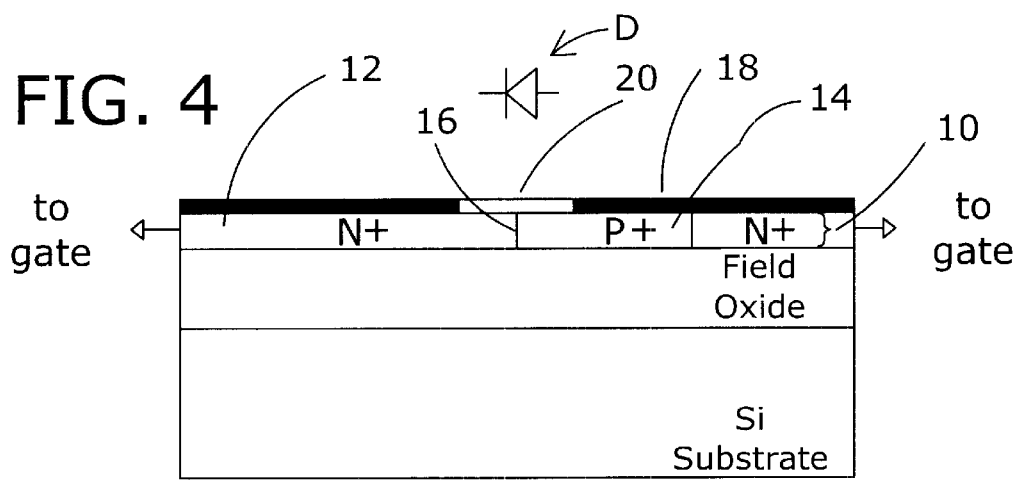
FIG. 4 illustrates, in cross-section, a dual work function polysilicon area of the CMOS static RAM cell of FIG. 3 in which a selected portion of the overlying conductive silicide has been removed in accordance with the present invention.

In accordance with the preferred embodiment and as shown in FIG. 4, the contiguous P and N doped regions of the dual work function polysilicon level 10 are rendered operable by not shunting the n and p doping regions, 12 and 14, in the immediate area of the polysilicon PN junction diode 16 that defines the path between the gates of the complementary PMOS and NMOS devices of the selected latch. As shown in FIG. 5, a window or opening 20 is formed in the overlying silicide layer 18 and the immediate vicinity of the PN junction 16 and is of an area and configuration to cause or allow the PN junction 16 to function as the diode D as described above in relationship to FIG. 2.

Thus, the absence of short-circuiting or shunting silicide in the immediate area of region of the polysilicon PN junction 16 thus provides a fully functional PN junction corresponding to the diode D shown in FIG. 2.

As is known, PN junction diodes formed in polycrystalline silicon have different characteristics than PN junction diodes formed in single crystalline silicon; these difference being a function of the granular morphology of the polysilicon, granular orientation or organization, and the relative quanta of grain boundaries in the material.

The embodiment of FIG. 2 is illustrative; an equivalent memory cell can be implemented by forming the polysilicon diode between the transistors T2 and T4 rather then between the transistors T1 and T3.

The present invention provides an improvement in SRAM cell functionality by providing an efficient way of assuring that the memory cell will assume a known state upon power-up.

As will be apparent to those skilled in the art, various changes and modifications may be made to the illustrated CMOS SRAM cell with prescribed power-on data state of the present invention without departing from the spirit and scope of the invention as determined in the appended claims and their legal equivalent.

What is claimed is:

1. A CMOS SRAM cell having a prescribed data state upon power-up, comprising:
    first and second cross-coupled inverters each defined by serially connected complementary MOS transistors (T1/T2;T3/T4) serially connected between a voltage source and a circuit ground to form a first inverter with a first data node (A) between the two transistors (T1/T2) of the first inverter and to form a second inverter with a second data node (B) between the two transistors (T3/T4) of the second inverter, the gates of transistors of the first inverter connected together and the gates of the second inverter connected together, the connected together gates of the first and second inverter cross-coupled to the data node of the other inverter, and a diode (D) connected in the connection between the gates of the transistors of only a selected one of the inverters wherein said diode (D) changes the gate charge time of its inverter to assure that each inverter will assume a pre-determined state upon power-up.

2. The CMOS SRAM cell of claim 1, wherein the gates are implemented in a dual work function polysilicon layer (10) having a PN junction (16) formed therein and an adjacent conductive layer (18), the diode (D) defined by a window or opening (20) formed in the conductive layer (18).

3. The CMOS SRAM cell of claim 2, wherein said dual work function polysilicon is a single polysilicon layer (10) having at least first and second adjacent regions (12,14) of opposite conductivity type that define said PN junction (16), the window or opening (20) of sufficient area and configuration in said conductive layer (18) to allow PN junction functionality between the first and second adjacent regions (12,14) of opposite conductivity type.

4. The CMOS SRAM cell of claim 3, wherein said conductive layer (18) is a silicide.

5. The CMOS SRAM cell of claim 1, further comprising:
    an access transistor connected between a bit line and a one of the first or second data nodes (A,B) to provide data access thereto.

6. The CMOS SRAM cell of claim 5, further comprising:
    a second access transistor connected between another bit line and another of the first or second data nodes (A,B) to provide data access thereto.

7. The CMOS SRAM cell of claim 1, further comprising dual work function polysilicon layer (10) having a PN junction formed therein and an adjacent conductive layer (18), said conductive layer being absent in a region surrounding said PN junction (16) of said polysilicon layer (10).

8. A 6T CMOS SRAM cell having a prescribed data state upon power-up, comprising:
    first and second cross-coupled inverters each defined by serially connected complementary MOS transistors (T1/T2;T3/T4) serially connected between a voltage source and a circuit ground to form a first inverter with a first data node (A) between the two transistors (T1/T2) of the first inverter and to form a second inverter with a second data node (B) between the two transistors (T3/T4) of the second inverter, the gates of transistors of the first inverter connected together and the gates of the second inverter connected together, the connected together gates of the first and second inverter cross-coupled to the data node of the other inverter, a first access transistor connected between a bit line (EL) and a one of the first or second data nodes (A,E) to provide data access thereto, a second access transistor connected between complementary bit line (ELC) and the other of the first or second data nodes (A,E) to provide data access thereto, and a diode (D) connected in the connection between the gates of the transistors of only a selected one of the inverters wherein said diode (D) changes the gate charge time of its inverter to assure that each inverter will assume a pre-determined state upon power-up.

9. The 6T CMOS SRAM cell of claim 8, wherein the gates are implemented in a dual work function polysilicon layer (10) having a PN junction (16) formed therein and an adjacent conductive layer (18), the diode (D) defined by a window or opening (20) formed in the conductive layer (18).

10. The 6T CMOS SRAM cell of claim 9, wherein said dual work function polysilicon is a single polysilicon layer (10) having at least first and second adjacent regions (12,14) of opposite conductivity type that define said PN junction (16), the window or opening (20) of sufficient area and configuration in said conductive layer (18) to allow PN junction functionality between the first and second adjacent regions (12,14) of opposite conductivity type.

11. The 6T CMOS SRAM cell of claim 9, wherein said conductive layer (18) is a silicide.

12. The 6T CMOS SRAM cell of claim 8, further comprising dual work function polysilicon layer (10) having a PN junction formed therein and an adjacent conductive layer (18), said conductive layer being absent in a region surrounding said PN junction (16) of said polysilicon layer (10).

* * * * *